(12) United States Patent
Nakazumi et al.

(10) Patent No.: US 10,324,788 B2
(45) Date of Patent: Jun. 18, 2019

(54) MEMORY SYSTEM

(71) Applicant: Toshiba Memory Corporation, Minato-ku, Tokyo (JP)

(72) Inventors: Shinichiro Nakazumi, Kawasaki Kanagawa (JP); Katsuhiko Ueki, Katsushika Tokyo (JP); Yoshihisa Kojima, Kawasaki Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/935,578

(22) Filed: Mar. 26, 2018

(65) Prior Publication Data

US 2018/0217896 A1 Aug. 2, 2018

Related U.S. Application Data

(62) Division of application No. 14/851,991, filed on Sep. 11, 2015, now Pat. No. 9,928,138.

(Continued)

(51) Int. Cl.
*G06F 11/10* (2006.01)
*G11C 16/26* (2006.01)
(Continued)

(52) U.S. Cl.
CPC ...... *G06F 11/1068* (2013.01); *G06F 11/1072* (2013.01); *G11C 7/1063* (2013.01);
(Continued)

(58) Field of Classification Search
CPC ... G06F 11/1068; G06F 11/1072; G11C 16/26
See application file for complete search history.

(56) References Cited

U.S. PATENT DOCUMENTS 5,058,115 A * 10/1991 Blake .................. G06F 11/1052
714/767
5,107,498 A * 4/1992 Hagihara ................ G06F 11/24
714/36

(Continued)

FOREIGN PATENT DOCUMENTS

JP 2012-203957 A 10/2012
JP 2013-122793 A 6/2013
JP 5349256 B2 11/2013

*Primary Examiner* — Joseph D Torres
(74) *Attorney, Agent, or Firm* — White & Case LLP

(57) ABSTRACT

According to one embodiment, a memory system includes a memory, and a processor. The memory converts an amount of charge held by a memory cell into a value. The processor executes a first process of reading first data from the memory. The processor executes a second process of reading the first data by making the memory use a first determination potential different in a case where error correction of the first data read through the first process is failed. The processor executes a third process of reading second data from the memory by making the memory use a third determination potential in a case where error correction of the first data read through the second process is succeeded. The third determination potential is the first determination potential used by the memory in a case where error correction of the first data read through the second process is succeeded.

12 Claims, 16 Drawing Sheets

Related U.S. Application Data

(60) Provisional application No. 62/117,301, filed on Feb. 17, 2015.

(51) Int. Cl.
*G11C 7/10* (2006.01)
*G11C 16/04* (2006.01)
*G11C 11/56* (2006.01)
G11C 29/02 (2006.01)
G11C 29/04 (2006.01)

(52) U.S. Cl.
CPC ...... *G11C 11/5642* (2013.01); *G11C 16/0483* (2013.01); *G11C 16/26* (2013.01); *G11C 29/021* (2013.01); *G11C 29/028* (2013.01); *G11C 2029/0409* (2013.01)

(56) References Cited

U.S. PATENT DOCUMENTS

| | | | | |
|---|---|---|---|---|
| 5,640,349 A * | 6/1997 | Kakinuma | ............ | G06F 3/0601 365/185.11 |
| 5,657,332 A * | 8/1997 | Auclair | ................. | G11C 16/10 365/184 |
| 5,724,285 A * | 3/1998 | Shinohara | ............ | G06F 11/0757 235/492 |
| 6,847,553 B2 * | 1/2005 | Chen | .................. | G11C 11/5621 365/185.03 |
| 7,315,916 B2 * | 1/2008 | Bennett | .............. | G06F 12/0246 711/103 |
| 8,365,030 B1 * | 1/2013 | Choi | .................. | G06F 11/1048 714/746 |
| 8,407,564 B2 * | 3/2013 | Nelson | ................ | G06F 11/1068 365/185.03 |
| 8,503,237 B1 * | 8/2013 | Horn | ...................... | G11C 29/42 365/185.03 |
| 8,510,636 B2 | 8/2013 | Ruby et al. | | |
| 8,510,637 B2 | 8/2013 | Tseng et al. | | |
| 8,687,421 B2 | 4/2014 | Avila et al. | | |
| 2004/0228197 A1 * | 11/2004 | Mokhlesi | ............... | G11C 16/06 365/232 |
| 2007/0091677 A1 * | 4/2007 | Lasser | ................. | G06F 11/1068 365/185.09 |
| 2008/0158979 A1 * | 7/2008 | Kamei | ................ | G11C 11/5628 365/185.19 |
| 2009/0164871 A1 * | 6/2009 | Jo | ...................... | G11C 16/3404 714/764 |
| 2009/0199074 A1 * | 8/2009 | Sommer | ............. | G06F 11/1072 714/763 |
| 2009/0292969 A1 * | 11/2009 | Man | .................... | G06F 11/1072 714/763 |
| 2009/0292970 A1 * | 11/2009 | Man | .................... | G11C 11/5642 714/763 |
| 2009/0292971 A1 * | 11/2009 | Man | .................... | G06F 11/1068 714/763 |
| 2010/0080040 A1 * | 4/2010 | Choi | .................. | G11C 11/5678 365/148 |
| 2010/0110815 A1 * | 5/2010 | Lee et al. | ............... | G11C 5/143 365/211 |
| 2011/0182119 A1 * | 7/2011 | Strasser | ................. | G11C 16/28 365/185.03 |
| 2012/0084490 A1 * | 4/2012 | Choi | ..................... | G11C 16/02 711/103 |
| 2012/0221917 A1 * | 8/2012 | Bueb | ................... | G06F 11/1012 714/755 |
| 2012/0233498 A1 * | 9/2012 | Ramaraju | .......... | G06F 11/1064 714/23 |
| 2012/0254699 A1 * | 10/2012 | Ruby | .................. | G06F 11/1048 714/773 |
| 2012/0257453 A1 * | 10/2012 | Shiino | .................... | G11C 16/26 365/185.18 |
| 2012/0268994 A1 | 10/2012 | Nagashima | | |
| 2013/0148435 A1 | 6/2013 | Matsunaga | | |
| 2013/0159785 A1 * | 6/2013 | Hashimoto | ........... | G06F 11/004 714/47.2 |
| 2013/0297988 A1 * | 11/2013 | Wu | .................... | G06F 11/1068 714/773 |
| 2014/0059398 A1 * | 2/2014 | Cunningham | ...... | G06F 11/1048 714/721 |
| 2014/0063940 A1 * | 3/2014 | Chen | ................... | G11C 11/5628 365/185.03 |
| 2015/0301885 A1 * | 10/2015 | Yuan | .................. | G06F 11/1004 714/807 |
| 2016/0071607 A1 * | 3/2016 | Kanno | ................. | G11C 11/5642 714/760 |
| 2016/0203873 A1 * | 7/2016 | Kuribara | ................ | G11C 16/26 365/185.24 |

\* cited by examiner

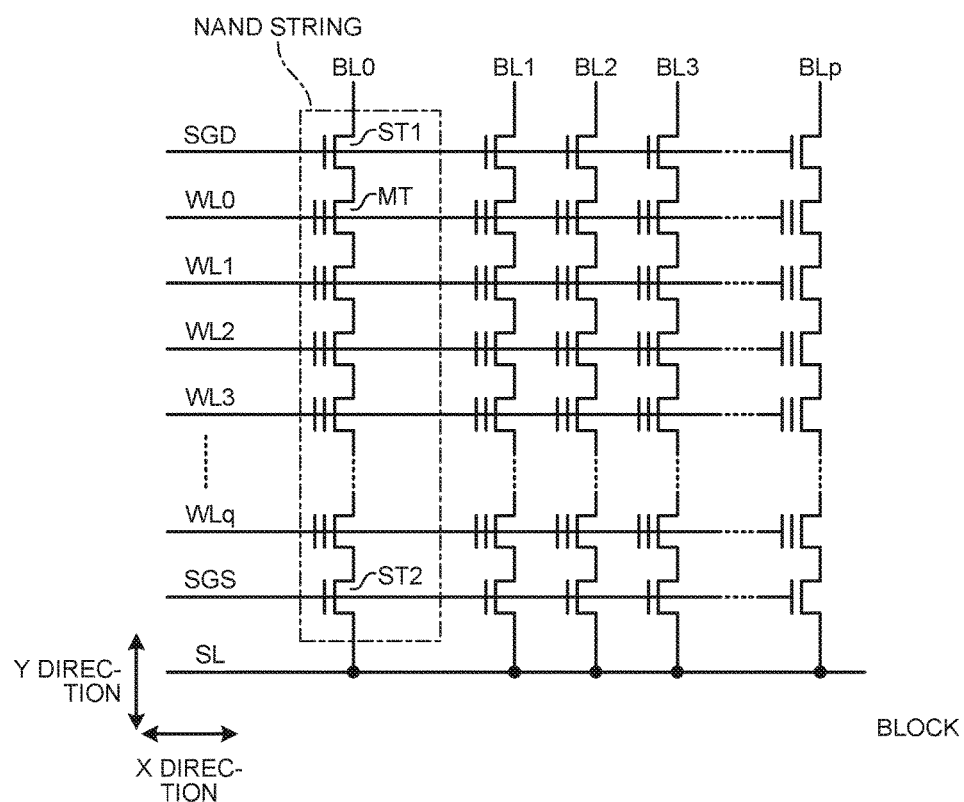
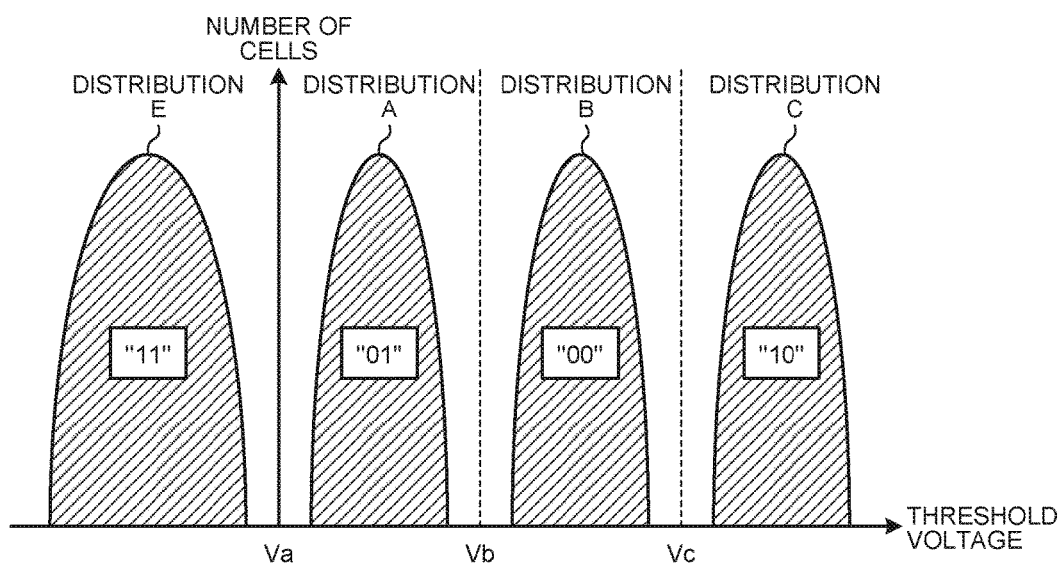

| SHIFT INDEX | SHIFT DEGREE A | SHIFT DEGREE B | SHIFT DEGREE C |
|---|---|---|---|
| 0 | -3 | -3 | -3 |
| 1 | -2 | -2 | -2 |
| 2 | -1 | -1 | -1 |
| 3 | 0 | 0 | 0 |
| 4 | 1 | 1 | 1 |
| 5 | 2 | 2 | 2 |

FIG.7

| SHIFT INDEX | SHIFT DEGREE A | SHIFT DEGREE B | SHIFT DEGREE C |
|---|---|---|---|
| 0 | -3 | 3 | 2 |
| 1 | -2 | 2 | 1 |
| 2 | -1 | 1 | 0 |
| 3 | -1 | 0 | 1 |
| 4 | 0 | -1 | 2 |
| 5 | 1 | -2 | 3 |

FIG.8

| BLOCK NUMBER | SHIFT INDEX |
|---|---|
| 0 | 0 |
| 1 | 2 |
| 2 | 1 |
| 3 | 2 |
| 4 | 4 |
| 5 | 4 |
| ... | ... |

FIG.14

| BLOCK GROUP NUMBER | SHIFT INDEX |
|---|---|
| 0 | 0 |
| 1 | 2 |
| 2 | 1 |
| 3 | 2 |
| 4 | 4 |
| 5 | 4 |
| ... | ... |

FIG.15

| LOGICAL BLOCK NUMBER | SHIFT INDEX |
|---|---|
| 0 | 0 |
| 1 | 2 |
| 2 | 1 |
| 3 | 2 |
| 4 | 4 |
| 5 | 4 |
| ... | ... |

| WORD LINE NUMBER | OFFSET |
|---|---|
| 0 | -0.3 |
| 1 | -0.2 |
| 2 | -0.1 |
| 3 | 0 |
| 4 | 0 |
| 5 | 0 |
| ... | ... |

| FIRST SHIFT INDEX | SHIFT DEGREE B |
|---|---|
| 0 | -3 |
| 1 | -2 |
| 2 | -1 |
| 3 | 0 |
| 4 | 1 |
| 5 | 2 |
| ... | ... |

FIG.21

| SECOND SHIFT INDEX | SHIFT DEGREE A | SHIFT DEGREE C |
|---|---|---|
| 0 | -3 | -3 |
| 1 | -2 | -2 |
| 2 | -1 | -1 |
| 3 | 0 | 0 |
| 4 | 1 | 1 |
| 5 | 2 | 2 |

FIG.22

| BLOCK NUMBER | FIRST SHIFT INDEX | SECOND SHIFT INDEX |
|---|---|---|
| 0 | 4 | 3 |
| 1 | 1 | 2 |
| 2 | 0 | 1 |
| 3 | 1 | 1 |
| 4 | 3 | 2 |
| 5 | 1 | 4 |
| ... | ... | ... |

MEMORY SYSTEM

CROSS-REFERENCE TO RELATED APPLICATIONS

This application is divisional of U.S. application Ser. No. 14/851,991, filed Sep. 11, 2015 and is based upon and claims the benefit of priority from U.S. Provisional Application No. 62/117,301, filed on Feb. 17, 2015; the entire contents of which are incorporated herein by reference.

FIELD

Embodiments described herein relate generally to a memory system.

BACKGROUND

Conventionally, semiconductor memories, having memory cells that hold charge of an amount corresponding to data, are widely known. Data stored in a memory cell is determined on the basis of comparison between a voltage according to the amount of charge held by the memory cell and a preset read voltage. The amount of charge held by a memory cell varies with time and at each access. In order to prevent data from being changed caused by variation in the amount of charge, techniques for shifting the read voltage according to variation in the amount of charge have been developed.

BRIEF DESCRIPTION OF THE DRAWINGS

FIG. 3 is a circuit diagram illustrating an example configuration of one block included in a memory cell array;
FIG. 4 is a graph illustrating distributions of threshold voltages;
FIG. 7 is a table illustrating another example data structure of a shift index table of the first embodiment;
FIG. 8 is a table illustrating an example data structure of a retry read table;
FIG. 9 is a chart illustrating operation of the memory system in a case of power-on;
FIG. 14 is a table illustrating an example data structure of a retry read table of the second embodiment;
FIG. 15 is a table illustrating an example data structure of a retry read table of a third embodiment;
FIG. 21 is a table illustrating an example data structure of a second shift index table;
FIG. 22 is a table illustrating an example data structure of a retry read table of the fifth embodiment.

DETAILED DESCRIPTION

In general, according to one embodiment, a memory system includes a memory, a first correction unit, and a processor. The memory stores data therein. The memory includes a memory cell configured to hold charge of an amount corresponding to a value included in the data. The memory converts an amount of charge held by the memory cell into the value in reading on the basis of comparison between the amount of charge held by the memory cell and a determination potential. The first correction unit executes error correction. The processor executes a first process of reading first data from the memory. The processor executes a second process of reading the first data by making the memory use a first determination potential different from a second determination potential in a case where the first correction unit fails in error correction of the first data read through the first process. The second determination potential is the determination potential used by the memory in the first process. The processor executes a third process of reading second data from the memory by making the memory use a third determination potential in a case where the first correction unit succeeds in error correction of the first data read through the second process. The third determination potential is the first determination potential used by the memory in a case where the first correction unit succeeds in error correction of the first data read through the second process.

Exemplary embodiments of the memory system will be explained below in detail with reference to the accompanying drawings. The present invention is not limited to the following embodiments.

First Embodiment

Figure 1:
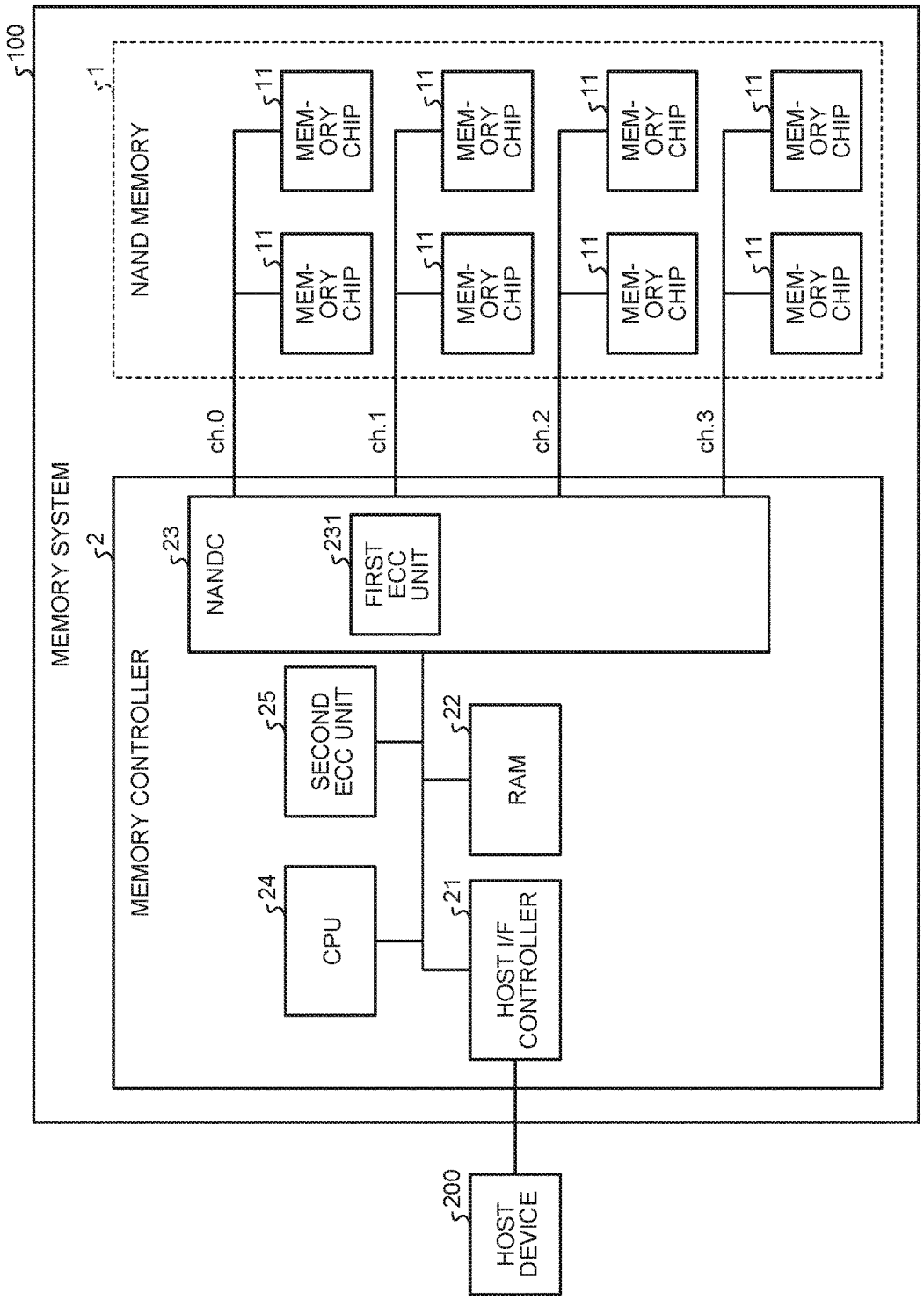
FIG. 1 is a diagram illustrating an example configuration of a memory system of a first embodiment.

FIG. 1 is a diagram illustrating an example configuration of a memory system of a first embodiment. A memory system 100 is connected to a host device 200 via communication interfaces in conformity with the ATA (Advanced Technology Attachment) standard, the SAS (Serial Attached SCSI) standard, the PCI (Peripheral Components Interconnect) Express standard, or the like. The host device 200 is a server, a personal computer, or a mobile information processing device, for example. The memory system 100 functions as an external storage device of the host device 200. The host device 200 can issue access requests (read requests and write requests) to the memory system 100.

The memory system 100 includes a NAND-type flash memory (NAND memory) 1, and a memory controller 2 that executes data transfer between the host device 200 and the NAND memory 1. Alternatively, the memory system 100 may have a memory of another type instead of the NAND memory 1. For example, the memory system 100 may have a NOR-type flash memory instead of the NAND memory 1.

The NAND memory 1 is constituted by multiple (herein, eight) memory chips 11 that are semiconductor memories. The memory controller 2 has four channels (ch. 0 to ch. 3).

Two memory chips 11 are connected to each of the channels. Each channel includes a control signal line, an I/O signal line, a CE (chip enable) signal line, and a RY/BY signal line. The I/O signal line is a signal line for sending data, addresses, and various instructions. The memory controller 2 can send read instructions, program instructions, and erase instructions to the memory chips 11 via the I/O signal lines. The control signal line collectively refers to a WE (write enable) signal line, a RE (read enable) signal line, a CLE (command latch enable) signal line, an ALE (address latch enable) signal line, a WP (write protect) signal line, and the like. The memory controller 2 can control two memory chips 11 connected to any one channel independently of the memory chips 11 connected to the other channels by utilizing the independence of groups of signal lines of the respective channels from one another. Since two memory chips 11 connected to the same channel share the groups of signal lines, the two memory chips 11 are accessed by the memory controller 2 at different timings.

Figure 2:
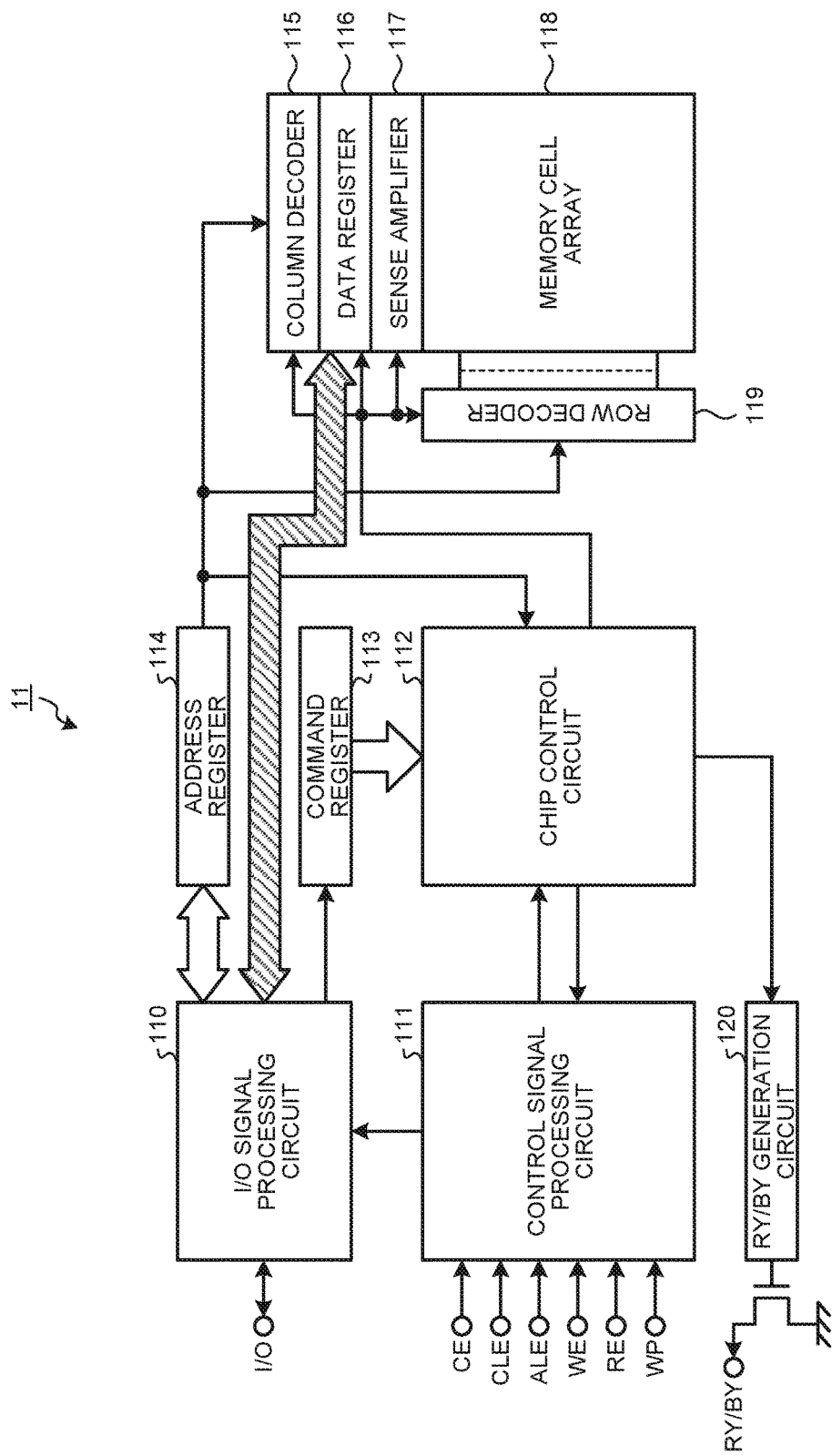
FIG. 2 is a diagram explaining an example configuration of each memory chip.

FIG. 2 is a diagram explaining an example configuration of each memory chip 11. A memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and a RY/BY generation circuit 120.

The chip control circuit 112 is a state transition circuit whose state is changed according to various control signals received via the control signal processing circuit 111. The chip control circuit 112 controls operation of the entire memory chip 11. The RY/BY generation circuit 120 switches the state of the RY/BY signal line between a ready state (RY) and a busy state (BY) under the control of the chip control circuit 112.

The I/O signal processing circuit 110 is a buffer circuit for sending/receiving I/O signals to/from the memory controller 2. Commands, addresses specifying access destinations, and data latched by the I/O signal processing circuit 110 are sorted and stored into the address register 114, the command register 113, and the data register 116, respectively.

Addresses stored in the address register 114 include chip addresses, row addresses, and a column addresses in descending order of levels. A chip address is identification information for distinguishing each memory chip 11. A chip address is read by the chip control circuit 112, a row address is read by the row decoder 119, and a column address is read by the column decoder 115.

The control signal processing circuit 111 receives control signals. The control signal processing circuit 111 directs I/O signals received by the I/O signal processing circuit 110 into registers for buffering according to the received control signals. The control signal processing circuit 111 also transfers the received control signals to the chip control circuit 112.

The memory cell array 118 includes multiple blocks each is a unit of erasure.

FIG. 3 is a circuit diagram illustrating an example configuration of one block included in the memory cell array 118. As illustrated, each block includes (p+1) NAND strings arranged sequentially along the X direction (p=0 or p>0). Selection transistors ST1 each included in each of (p+1) NAND strings have drains connected to bit lines BL0 to BLp and gates connected to a selection gate line SGD in common. Selection transistors ST2 have sources connected to a source line SL in common and gates connected to a selection gate line SGS in common.

Each memory cell transistor MT is an MOSFET (Metal Oxide Semiconductor Field Effect Transistor) having a stacked gate structured formed on a semiconductor substrate. The stacked gate structure includes a floating gate formed on the semiconductor substrate with a tunnel oxide film therebetween, and a control gate electrode formed on the floating gate with an inter-gate insulating film therebetween. A threshold voltage changes according to the number of electrons stored in the floating gate. The memory cell transistors MT store data therein according to differences in threshold voltages. Specifically, the memory cell transistors MT hold charge of the amount corresponding to data in the floating gates.

In each NAND string, (q+1) memory cell transistors MT are arranged between the source of the selection transistor ST1 and the drain of the selection transistor ST2 so that current paths thereof are connected in series. The control gate electrodes of the memory cell transistors MT are connected to word lines WL0 to WLq sequentially from the memory cell transistor MT located closest to the drain. Thus, the drain of the memory cell transistor MT connected to the word line WL0 is connected to the source of the selection transistor ST1, and the source of the memory cell transistor MT connected to the word line WLq is connected to the drain of the selection transistor ST2.

The word lines WL0 to WLq each connect the control gate electrodes of the memory cell transistors MT through the NAND strings in the block. Specifically, the control gate electrodes of the memory cell transistors MT that are on the same row in the block are connected by one word line WL. In a case where each memory cell transistor MT can hold a 1-bit value, (p+1) memory cell transistors MT connected by the same word line WL are treated as one page, and program of data and read of data are performed by the unit of page.

Each memory cell transistor MT may be configured to store a multi-bit value. In a case where each memory cell transistor MT can store an n-bit value (n=2 or n>2) therein, for example, the storage capacity per word line is equal to the size of n pages. Herein, a storage system in which each memory cell transistor MT stores a 2-bit value (hereinafter referred to as a 2-bit memory cell) therein will be described as an example. According to the 2-bit memory cell, data corresponding to two pages is stored in each word line. Among the two pages of one word line, one page into which writing is performed first will be referred to as a lower page, and the other page into which writing is performed next will be referred to as an upper page. In addition, the memory cell transistors MT will be simply referred to as memory cells.

FIG. 4 is a graph illustrating distributions of threshold voltages of the group of memory cells in a case where the 2-bit memory cell is adopted. In FIG. 4, the horizontal axis represents the threshold voltage and the vertical axis represents the number of memory cells. According to the 2-bit memory cell, each memory cell can hold quaternary data "xy" defined by data "x" belonging to the upper page and data "y" belonging to the lower page. The values of the data "x" and the data "y" are a code "0" or a code "1". Control is performed so that the threshold voltages of the memory cells belong to any of four groups, which are a distribution E, a distribution A, a distribution B, and a distribution C. Association between the distributions and the quaternary data "xy" is set in advance. For example, a code "11" is assigned to the distribution E. A code "01" is assigned to the distribution A. A code "00" is assigned to the distribution B. A code "10" is assigned to the distribution C. Note that the association between the distribution and the quaternary data "xy" is not limited to that described above. Any system in which data are assigned to the distributions so that the Hamming distance between adjacent distributions is 1 can be adopted.

The row decoder 119, the column decoder 115, the data register 116, and the sense amplifier 117 constitute a peripheral circuit. The peripheral circuit executes accesses (read, program, and erase) to the memory cell array 118 under control of the chip control circuit 112.

In programming, for example, the column decoder 115 selects and activate a bit line associated with a read column address. The sense amplifier 117 sets the potential of the bit line selected by the column decoder 115 to 0 V. The row decoder 119 applies a programming pulse to the word line associated with a read row address. Electrons are then injected into the floating gate of the memory cell located at the intersection of the selected bit line and the selected word line, and as a result, the threshold voltage of the floating gate increases. The sense amplifier 117 checks whether or not the threshold voltage has reached a voltage corresponding to data stored in the data register 116 each time the programming pulse is applied. The sense amplifier 117 makes the row decoder 119 continue to apply the programming pulse until the threshold voltage reaches the voltage corresponding to the data.

In reading, the sense amplifier 117 precharges the bit lines BL to a power supply potential Vcc, and the row decoder 119 sequentially applies multiple determination potentials (hereinafter referred to as read voltages) for determining the distributions for the respective codes ("11", "01", "00", and "10") to the selected word line WL. Note that the row decoder 119 applies a transfer potential to unselected word lines WL to keep the memory cells belonging to the unselected word lines WL in a conduction state. The sense amplifier 117 determines data stored in a target memory cell by detecting which read voltage has been applied when the charge stored by precharging has flowed out to the source line SL.

As illustrated in FIG. 4, for example, a read voltage VA is set between the distribution E and the distribution A, a read voltage VB is set between the distribution A and the distribution B, and a read voltage VC is set between the distribution B and the distribution C.

In a case where the page to be read is a lower page, the read voltage VB is used for determination. In a case where flow-out of the charge to the source line SL is detected when the read voltage VB is applied, the sense amplifier 117 determines that the target memory cell stores the code "1" therein. In a case where flow-out of the charge to the source line SL is not detected when the read voltage VB is applied, the sense amplifier 117 determines that the target memory cell stores the code "0" therein.

In a case where the page to be read is an upper page, the read voltage VA and the read voltage VC are used for determination. In a case where flow-out of the charge is detected when the read voltage VA is applied or in a case where flow-out of the charge is not detected both when the read voltage VA is applied and when the read voltage VC is applied, the sense amplifier 117 determines that the target memory cell stores the code "1" therein. In a case where flow-out of the charge is not detected when the read voltage VA is applied and in a case where flow-out of the charge is detected when the read voltage VC is applied, the sense amplifier 117 determines that the target memory cell stores the code "0" therein.

In erasing, an erase voltage is applied to the substrate of the memory cell array 118 by a potential generation circuit (not illustrated). The row decoder 119 then connects all the word lines WL of the block to be erased to ground potential. Then, in each of the memory cells in the selected block, the charge stored in the floating gate is released. As a result, the state of the memory cells in the selected block is changed to an erased state (that is, a state in which the code "11" is stored therein).

The sense amplifier 117 stores read data into the data register 116. The data stored in the data register 116 is sent to the I/O signal processing circuit 110 via a data line, and transferred to the memory controller 2 from the I/O signal processing circuit 110.

Note that the read voltages VA to VC are stored in any storage unit in the memory chip 11. For example, the memory chip 11 stores therein reference values (fixed values) of the read voltages VA to VC. The reference values of the respective read voltages VA to VC may be set to the same values for the multiple memory chips 11 or may be set to different values for different memory chips 11. Alternatively, the reference values of the respective read voltages VA to VC may be set to the same values for each block or for each unit different from a block. The reference values may be set in any manner. The processor may set the reference values of the read voltages by sending a predetermined command to the target memory chip 11.

The memory controller 2 can shift the read voltages VA to VC. The memory controller 2 sends differences (shift degrees) of the read voltages VA to VC from the reference values to the memory chips 11. The sense amplifier 117 carries out data determination by using the read voltages VA to VC obtained by adding the shift degrees to the respective reference values. Note that the manner in which the shifted read voltages VA to VC are set is not limited thereto. For example, the memory controller 2 may send the shifted read voltages VA to VC to the memory chips 11.

The memory controller 2 includes a host interface controller (host I/F controller) 21, a RAM (Random Access Memory) 22, a NAND controller (NANDC) 23, a CPU (Central Processing Unit) 24, and a second ECC (Error Checking and Correction) unit 25. The host I/F controller 21, the RAM 22, the NAND controller 23, the CPU 24, and the second ECC unit 25 are connected with one another via a bus.

The RAM 22 functions as a buffer for data transfer between the host device 200 and the NAND memory 1. The RAM 22 also provides a work area for the CPU 24. The RAM 22 also has stored therein various information for management of the read voltages. Details of the information for management of the read voltages will be described later. Note that the RAM 22 may be of any type. For example, a DRAM (Dynamic Random Access Memory) or an SRAM (Static Random Access Memory) can be applied thereto.

The CPU 24 function as a processor that controls the entire memory controller 2 on the basis of firmware. The firmware is stored in advance in the NAND memory 1, for example, and loaded into the work area in the RAM 22 from the NAND memory 1 by the CPU 24 when the memory system 100 is started. The CPU 24 executes the firmware loaded in the work area.

The host I/F controller 21 controls the communication interface between the host device 200 and the memory system 100 and data transfer between the host device 200 and the RAM 22 under the control of the CPU 24.

The NAND controller 23 controls four channels (ch. 0 to ch. 3). The NAND controller 23 controls data transfer between the NAND memory 1 and the RAM 22 under the control of the CPU 24.

The NAND controller 23 includes a first ECC unit 231. The first ECC unit 231 corrects errors occurred during reading of data from the NAND memory 1. In a case where the first ECC unit 231 has failed in the error correction, the first ECC unit 231 reports that effect to the processor.

The second ECC unit 25 corrects errors occurred during reading of data from the NAND memory 1. In a case where the second ECC unit 25 has failed in the error correction, the second ECC unit 25 reports that effect to the processor. The second ECC unit 25 has a higher correction capability than the first ECC unit 231. The correction capability means the number of correctable error bits per data of a predetermined size. The number of correctable error bits per data of a predetermined size is larger as the correction capability is higher.

In a memory chip 11, the amount of charge held in the floating gate changes with time. The amount of charge held in the floating gate is also changed by read or program to an adjacent memory cell. The threshold distributions resulting from program are changed by these phenomena, and as a result, data vary in program and in read.

For a change in data, the processor corrects errors and shifts the read voltages. Specifically, in a case where error correction by the first ECC unit 231 has been a failure, the process executes reading from the memory chip 11 again with changed read voltages (retry read). A failure in error correction means that data before a change cannot be recovered from data resulting from the change. Specifically, a failure in error correction means that one or more error bits contained in data cannot be corrected. Successful error correction means that all the error bits contained in data have been corrected. In a case where error correction is still not successful as a result of retry read, the processor makes the second ECC unit 25 execute error correction.

In order to decrease the number of executions of retry read, the processor applies the read voltages used when error correction by the first ECC unit 231 was successful to the next reading. In the first embodiment, the processor manages the read voltages by a unit of a block.

The processor also executes patrol read. Patrol read is a process of reading data that was once programmed when time elapsed since execution of the program regardless of whether there is a reception of a read command from the host device 200. Herein, as an example, description will be made on the assumption that the patrol read is executed periodically (herein, at regular intervals of T1) after execution of program. In a case where there is another process (a process in response to a read command from the host device 200, for example) to which priority is given over the patrol read even when the timing at which the patrol read is to be executed is reached, the processor may start the patrol read after execution of the process to which priority is given over the patrol read. Thus, the actual execution period of the patrol read need not be exactly T1.

The processor sets a block to a block to be refreshed according to the result of the patrol read.

Refreshing a block means copying at least all valid data out of data stored in a block into another block. Refreshing the block may be including erasing all the data stored in the source block after the copying. Note that the source block and the destination block may be the same. In a case where the source block and the destination block are the same, at least all valid data stored in the block to be refreshed are read into the RAM 22, for example, then all the data stored in the block to be refreshed are erased, and the data read into the RAM 22 are written in the block in which the data are erased. Hereinafter, to refresh a block means that to execute refresh applying the block as the source block. In the present embodiment, the second ECC unit 25 has the highest correction capability of all the correcting functions included in the memory system 100. The processor refreshes a block before the number of error bits contained in data stored in the block exceeds an amount that can be corrected by the second ECC unit 25.

Note that the processor can also execute retry read in patrol read.

Figures 5, 6:
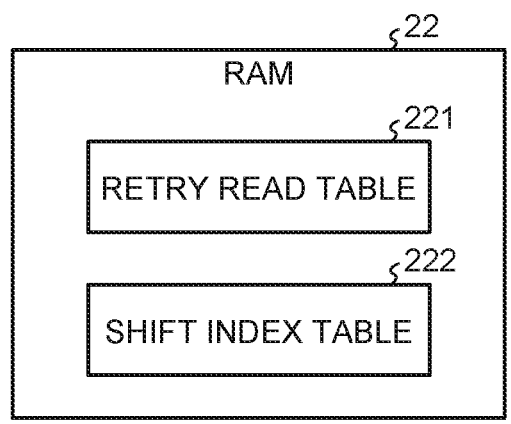
FIG. 5 is a diagram explaining various information stored in a RAM.
FIG. 6 is a table illustrating an example data structure of a shift index table of the first embodiment.

FIG. 5 is a diagram explaining various information for management of read voltages stored in the RAM 22. As illustrated, a retry read table 221 and a shift index table 222 are stored in the RAM 22.

FIG. 6 is a table illustrating an example data structure of the shift index table 222. The shift index table 222 has multiple shift patterns recorded therein. A shift pattern means a combination of the read voltages VA to VC. The read voltages are expressed in the form of differences (shift degrees) from the reference values. In FIG. 6, a shift degree X (X is A, B, or C) represents a difference from the reference value of the read voltage VX.

Shift indices for searching are assigned to the respective shift patterns recorded in the shift index table 222 in the order of arrangement. Herein, as an example the processor selects the shift patterns to be applied in the order of the shift indices. The order of arrangement of the shift patterns can be designed in any manner. The shift patterns may be arranged in view of the tendency of temporal change in the threshold distributions. The processor may manage order information that defines the order in which the shift patterns to be applied are selected separately from the shift index table 222. Note that the order information may be in any data format.

The shift patterns can be designed in any manner. In the example of FIG. 6, the shift degrees of the read voltages are set to the same value in the same shift pattern. As illustrated in FIG. 7, the shift degrees of the read voltages may be set to different values in the same shift pattern.

The shift index table 222 is stored in advance in the NAND memory 1. The processor loads the shift index table 222 from the NAND memory 1 into the RAM 22 in a case of power-on.

FIG. 8 is a table illustrating an example data structure of the retry read table 221. The retry read table 221 has recorded therein shift indices of respective blocks. In FIG. 8, a block number is an identification number for distinguishing each block in the NAND memory 1. Herein, as an example, the processor does not save the retry read table 221 in to the NAND memory 1 when power is turned off. The processor create a new retry read table 221 in the RAM 22 after power is turned on. The retry read table 221 is not saved because the threshold distributions also change during the power-off state and there is little advantage in continuously using the retry read table 221 immediately before power-off. Furthermore, in a case where the processor is configured to save the retry read table 221, a disadvantage that the amount of data to be saved is increased is caused.

Next, operation of the memory system 100 of the first embodiment will be described.

Figure 9:
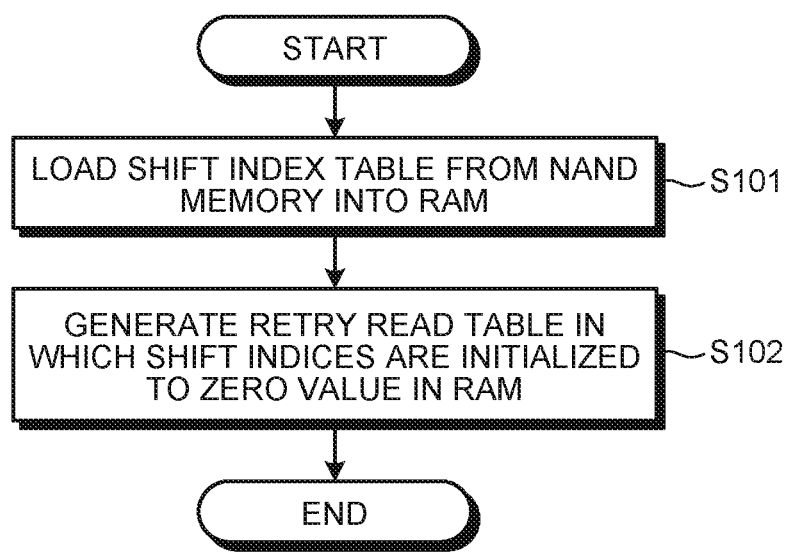

FIG. 9 is a chart illustrating operation of the memory system 100 in a case of power-on. In a case of power-on, the processor loads the shift index table 222 from the NAND memory 1 into the RAM 22 (S101). Subsequently, the processor generates a retry read table 221 in the RAM 22 (S102), and terminates the operation. Note that all the entries in the retry read table 221 generated in S102 are initialized to a predetermined shift index (a first shift index in the shift index table 222, for example). The shift index to which the entries are initialized can be designed in any manner.

Figure 10:
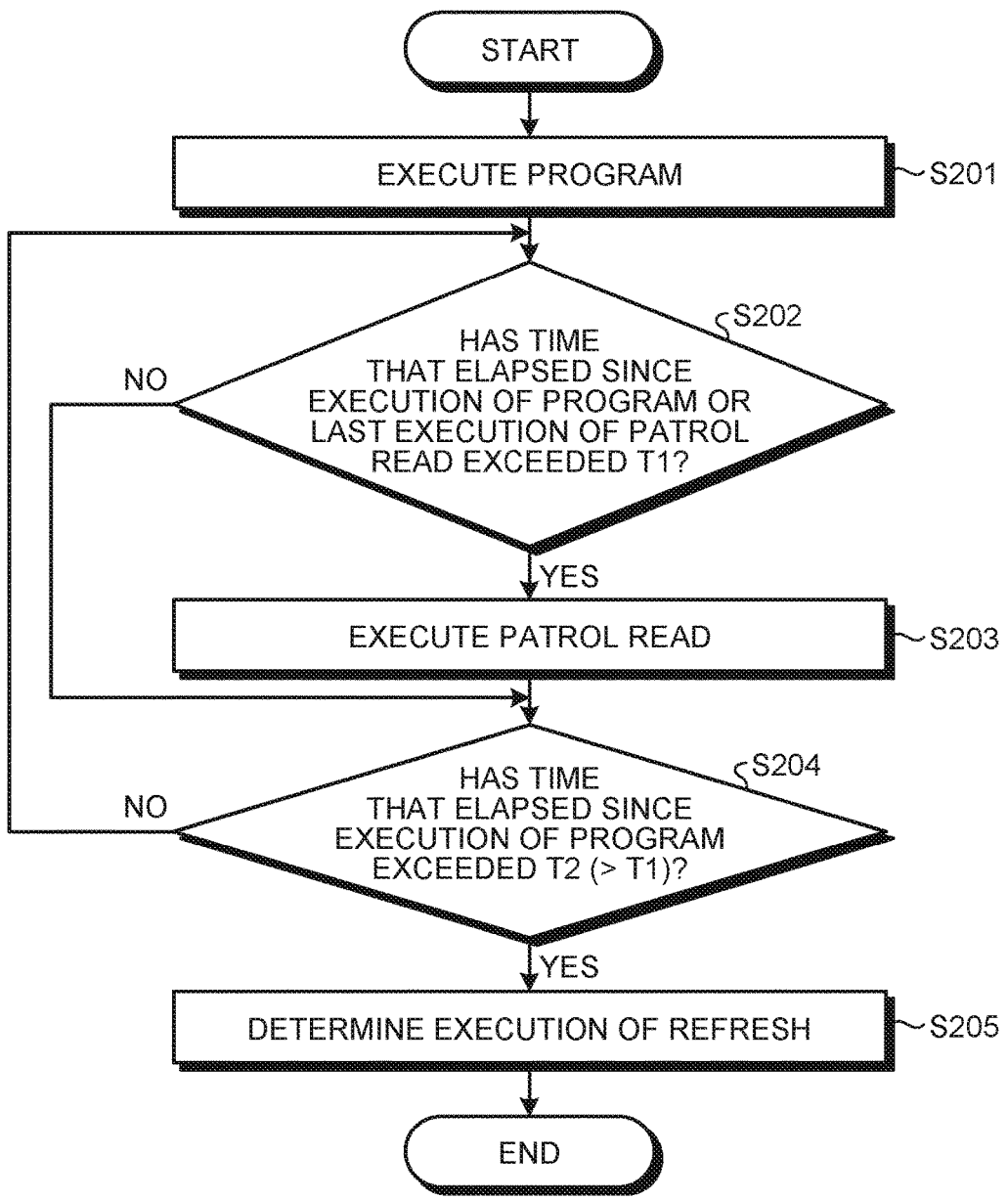
FIG. 10 is a flowchart explaining patrol read.

FIG. 10 is a flowchart explaining the patrol read. The processor executes a series of processes illustrated in FIG. 10 for each block. At the start, one block to be focused in the description of FIG. 10 (a target block in the description of FIG. 10) is assumed to have been erased and be in a state in which no data are written therein.

First, the processor executes program of the target block (S201). The processor then determines whether or not time that elapsed from execution of program on the target block or time that elapsed from execution of patrol read on the target block has exceeded a time T1 (S202). T1 is the execution period of the patrol read. T1 is set in advance in the processor, for example. Time that elapsed from execution of program on a target block may be time that elapsed since the program on the target block was started from the state in which no data are written therein or may be time that elapsed since the entire target block was fully programmed with data. In a case where patrol read is already executed on the target block, the processor determines whether or not time that elapsed from the patrol read that was most recently executed has exceeded the time T1 in S202.

In patrol read, a part or all of data are read from the target block. Detail of process of the patrol read will be described later. The processor may determine, based on a result of patrol read, execution of refresh on a block to which the patrol read has been executed. In this case, the processor can terminate the processing flow illustrated in FIG. 10 in the middle thereof.

In a case where time that elapsed from execution of program or time that elapsed from execution of patrol read has exceeded the time T1 (Yes in S202), the processor executes patrol read on the target block (S203). In a case where time that elapsed from execution of program has not exceeded the time T1 and time that elapsed from execution of patrol read has not exceeded the time T1 (No in S202), the processor skips the process in S203.

Subsequently, the processor determines whether or not time that elapsed from execution of program on the target block has exceeded T2 (S204). T2 is a value larger than T1. T2 is set in in advance in the processor, for example. A value smaller than time that elapsed until an amount of change of the threshold distributions exceeds an amount of change that can be error-corrected by the second ECC unit 25, for example, is set as T2. In a case where time that elapsed from execution of the program has exceeded T2 (Yes in S204), the processor determines execution of refresh on the target block (S205) and terminates the operation. In a case where time that elapsed from execution of the program has not exceeded T2 (No in S204), the processor performs the process of S202 again.

Figure 11:
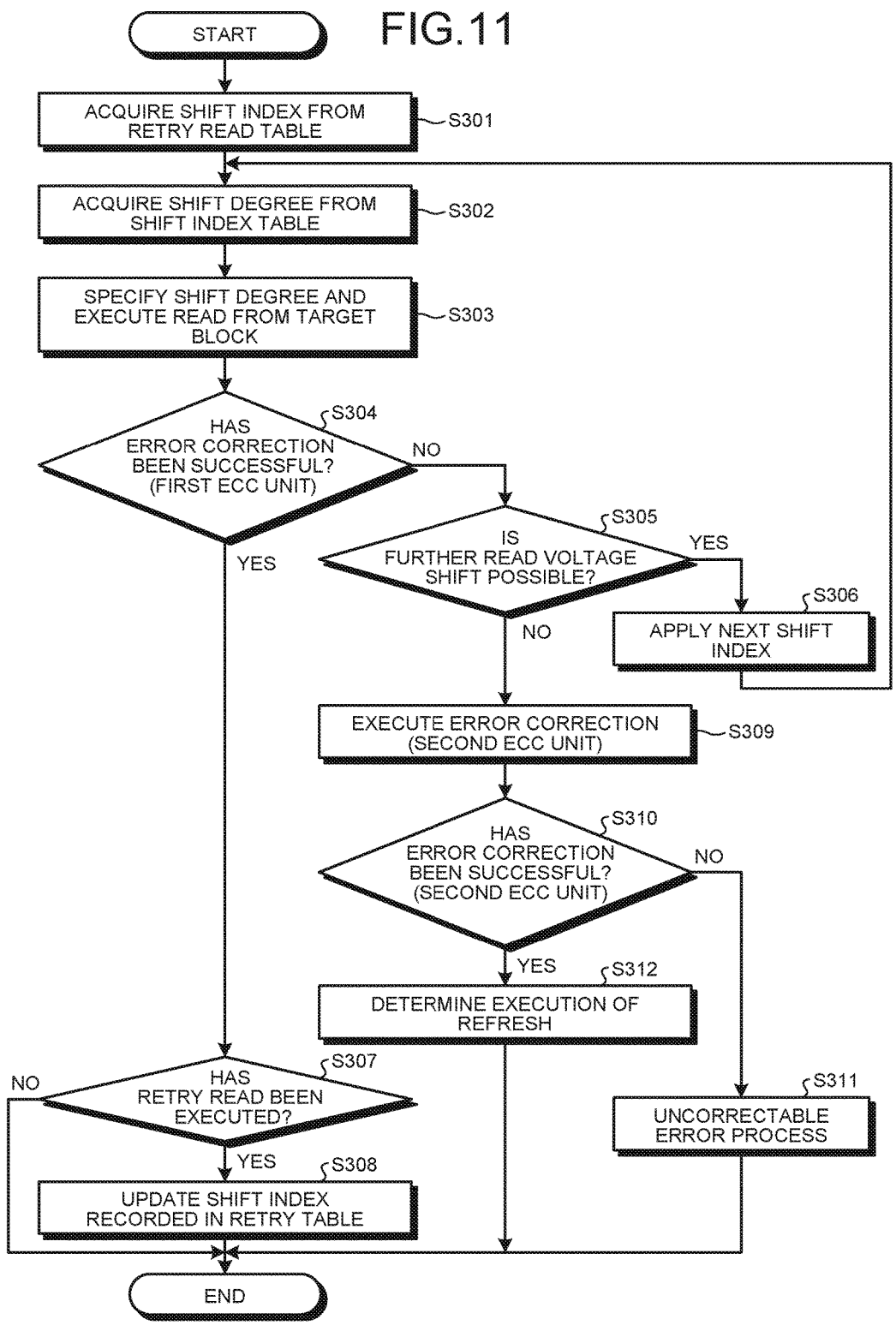
FIG. 11 is a flowchart explaining a read process.

FIG. 11 is a flowchart explaining a read process. The read process is a process started after the data to be read is determined. Specifically, the read process is a process from starting operation of acquiring data to be read to completion of the acquisition of the data to be read. Completion of acquisition of data to be read means reading data to be read from the NAND memory 1 and succeeding in error correction of the read data. Thus, one read process includes one or more times of read (including retry read) from the NAND memory 1. In patrol read, the read process is executed. Furthermore, a process of reading data requested by the host device 200 from the NAND memory 1 corresponds to a read process. The processor executes the read process presented below for each block. At the start, one block to be focused in the description of FIG. 11 (a target block in the description of FIG. 11) is assumed to be in a state in which data are already written therein.

First, the processor acquires a shift index associated with the target block by searching the retry read table 221 using the block number of the target block as a search key (S301). The processor acquires a shift pattern associated with the target block by searching the shift index table 222 using the acquired shift index as a search key (S302). Through the processes of S301 and S302, a shift pattern generated at startup or a shift pattern containing the shift degrees used when the error correction by the first ECC unit 231 was most recently successful in a read process executed previously can be acquired. The processor specifies the shift degrees contained in the acquired shift pattern and executes read from the target block (S303).

The memory chip 11 having the target block reads data from the target block by using read voltages obtained by applying the specified shift degrees to the reference values. The memory chip 11 outputs the read data to the memory controller 2.

In the memory controller 2, the first ECC unit 231 executes error correction on the data from the memory chip 11. In a case where the first ECC unit 231 has failed in the error correction, the first ECC unit 231 reports the failure to the processor, for example. The processor determines whether or not the error correction by the first ECC unit 231 is successful (S304). The processor executes the determination in S304 on the basis of whether the failure report or a success report of the error correction is received. In a case where the error correction by the first ECC unit 231 has been a failure (No in S304), the processor determines whether or not the read voltages can be shifted (S305).

Note that the method for the process of S305 can be designed in any manner. For example, the processor sequentially applies the shift patterns in the order of arrangement of shift indices. In a case where a shift pattern specified most recently is a shift pattern recorded at the end of the shift index table 222, the processor determines that the read voltages cannot be shifted further in the determination process of S305. In a case where the shift pattern specified most recently is not a shift pattern recorded at the end of the shift index table 222, the processor determines that the read voltages can be shifted further in the determination process of S305.

Furthermore, for example, in a case where the error correction by the first ECC unit 231 has not been successful even when all the shift patterns recorded in the shift index table 222 have been applied, the processor determines that the read voltages cannot be shifted further in the determination process of S305. In a case where a shift pattern that has not been applied is present in the shift patterns recorded in the shift index table 222, the processor determines that the read voltages can be shifted further in the determination process of S305.

In a case where the read voltages can be shifted further (Yes in S305), the processor applies the next shift index (S306), and executes the process of S302 again using the next shift index as a search key. Note that applying the next shift index means incrementing the shift index by 1.

In a case where the error correction by the first ECC unit 231 has been successful (Yes in S304), the processor determines whether or not retry read has been executed (S307). In a case where the error correction by the first ECC unit 231 has been successful after executing the process of S306 at least one, the processor determines "Yes" in the determination process of S307. In a case where the error correction by the first ECC unit 231 has been successful without execution of the process of S306, the processor determines "No" in the determination process of S307. In a case where the retry read has been executed (Yes in S307), the processor updates the shift index recorded in the retry read table 221 and associated with the target block with the shift index used when the error correction by the first ECC unit 231 has been successful (S308), and terminates the operation. In a case where the retry read has not been executed (No in S307), the processor skips the process of S308.

In a case where the read voltages cannot be shifted (No in S305), the processor makes the second ECC unit 25 execute error correction (S309). The processor then determines whether or not the error correction by the second ECC unit 25 has been successful (S310). In a case where the error correction by the second ECC unit 25 has been a failure (No in S310) the processor executes an uncorrectable error process (S311) and terminates the operation.

The uncorrectable error process is a process in response to the result that data cannot be recovered. The uncorrectable error process can be designed in any manner. For example, the uncorrectable error process is that the processor notifies the host device 200 that data has been lost. The processor may refresh only data that has not been lost as part of the uncorrectable error process.

In a case where the error correction by the second ECC unit 25 has been successful (Yes in S310), the processor determines execution of refresh on the target block (S312), and terminates the operation.

The timing of execution of refresh can be designed in any manner. For example, the processor executes refresh at a timing when any other process to which priority over the refresh is given is not being executed.

As described above, according to the first embodiment, the first ECC unit 231 executes error correction of data read from a block in the read process. In a case where the first ECC unit 231 has failed in the error correction, the processor changes the read voltages and executes retry read. In a case where the error correction of data read through the retry read has been successful, the processor executes, in the next read process, a read process on the block by using the read voltages used when the error correction of the data read through the retry read has been successful.

In contrast to the technique of the first embodiment, a technique (comparative example) of executing a new read process without considering the read voltages used when error correction has been successful in a previous read process can be conceived. According to the comparative example, a process of acquiring shift indices sequentially from a predetermined location in the shift index table 222 needs to be executed for each read process. Thus, in a case where the read process is executed multiple times on the same block, retry read using the read voltages that, when being set, cause the error correction to result in a failure is executed redundantly. According to the first embodiment, since the processor applies the read voltages used when error correction has been successful in the next read process, the number of times retry read is executed can be reduced.

Furthermore, the processor stores multiple shift patterns in the form of the shift index table 222 therein, and selects a shift pattern for retry read from the shift patterns. The processor selects a shift pattern for each retry read in the order of shift indices recorded in the shift index table 222. This allows the processor to efficiently select a shift pattern. For example, this allows the processor to select a shift pattern in the order in view of the tendency of temporal change in the threshold distributions.

The processor also records the shift index used when the error correction has been successful in the retry read table 221. In the next read process, the processor then searches for a shift pattern by using the shift index recorded in the retry read table 221 as a search key. As a result, the processor can easily apply the read voltages that are the same as those used when the error correction has been successful in the next read process.

Furthermore, in a case where the first ECC unit 231 has not succeeded in the error correction even when retry read has been executed until the read voltages cannot be shifted any more, the processor determines the data as data to be refreshed. Note that the processor may determine data to be refreshed before further shifting of the read voltages becomes impossible. For example, the processor may determine data to be refreshed when the read voltages have reached predetermined voltages and the first ECC unit 231 has failed in error correction. Thus, the processor executes refresh at least on the basis of whether or not the first ECC unit 231 has failed in error correction of data read through retry read. In a case where the error correction by the second ECC unit 25 has been a failure, an uncorrectable error process is executed on the data.

Furthermore, the processor also executes retry read and recording of the shift index in patrol read.

The processor also manages the shift indices by a unit of a block. As a result, the size of the retry read table 221 can be made smaller than that in a case where the shift indices are managed by a unit of a page, for example.

It has been explained above that the processor manages the read voltages to be used by the memory chips 11 in the form of shift degrees. The processor, however, may manage the read voltages to be used by the memory chips 11 in any form in which the read voltages to be used can be specified.

Second Embodiment

In a second embodiment, the processor manages shift indices in a unit of multiple blocks.

Figure 12:
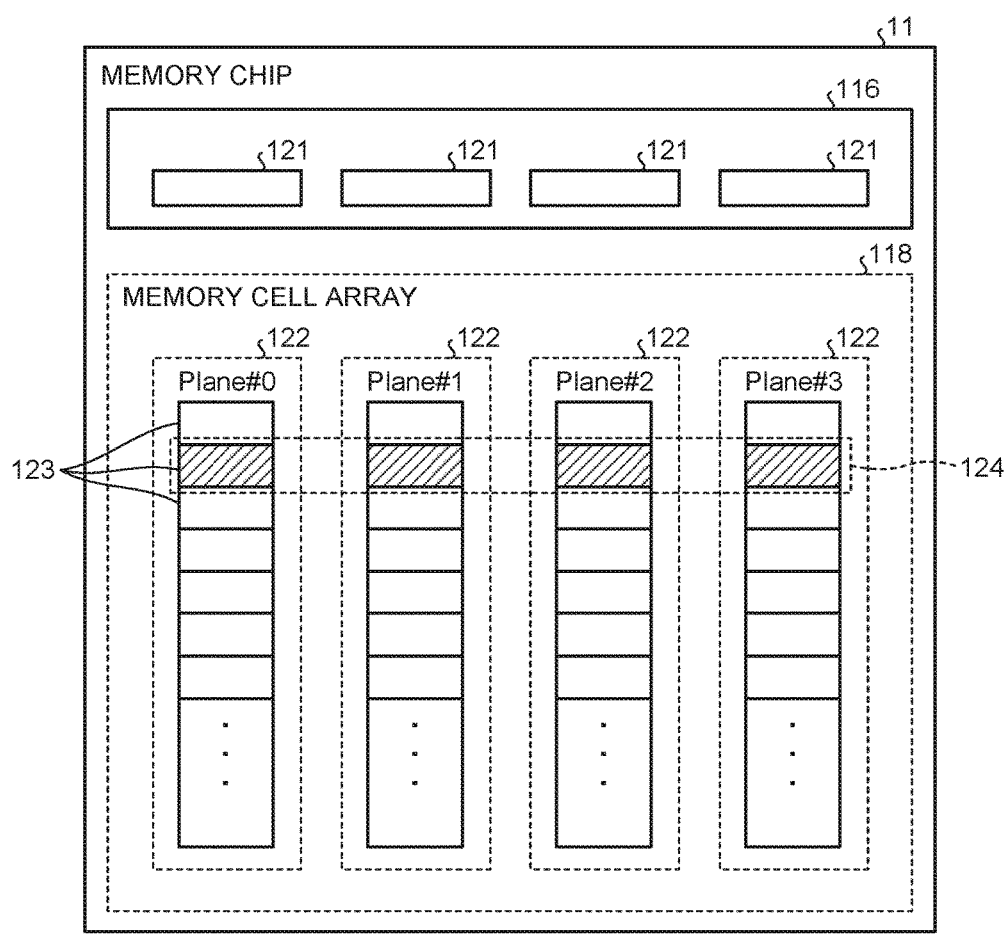
FIG. 12 is a diagram illustrating an example configuration of a memory chip of a second embodiment.

FIG. 12 is a diagram illustrating an example configuration of a memory chip 11 of the second embodiment. Herein, only components that are different from those in the first embodiment will be described. According to the second embodiment, the memory cell array 118 is divided into multiple planes 122. Herein, as an example, the memory cell array 118 is divided into four planes 122. The planes 122 each include multiple blocks 123. The planes 122 each have a peripheral circuit independent of one another, which allows the memory chip 11 to execute erase/program/read simultaneously on the planes 122 in multi-plane operations. Each of four planes 122 in each memory chip 11 is identified by using a plane number (Plane#0 to Plane#3).

In the memory chip 11, four blocks 123 belonging to the planes 122 different from one another are accessed at the same time in the multi-plane operations. The four blocks 123 that can be accessed at the same time will be referred to as a block group. Each memory chip 11 includes multiple block groups 124. Erase can be executed on four blocks 123 constituting one block group 124 in parallel at the same timing. Program or read can be executed on four pages belonging to the respective four blocks 123 constituting one block group 124 in parallel at the same timing. The technique of executing read on multiple pages in the same block group 124 in parallel will be referred to as multi-plane read.

Each page is identified by use of a unique page number in one plane 122. The page numbers of four pages on which program or read is executed at the same timing may be the same through the four blocks 123 constituting one block group 124 or may be different.

The combination of the four blocks 123 constituting each block group 124 is statically or dynamically defined. In the example of FIG. 12, four hatched blocks 123 constitute one block group 124, for example.

The data register 116 includes four page buffers 121 associated with the respective planes 122. Each page buffer 121 has a size at least equal to one page or larger. Each page buffer 121 is constituted by a register or a small memory. Each page buffer 121 is constituted by a SRAM (Static Random Access Memory), for example. Each page buffer 121 functions as a buffer for transfer between the memory controller 2 and each plane 122. Hereinafter, data having a size of one page may be referred to as page data.

Figure 13:
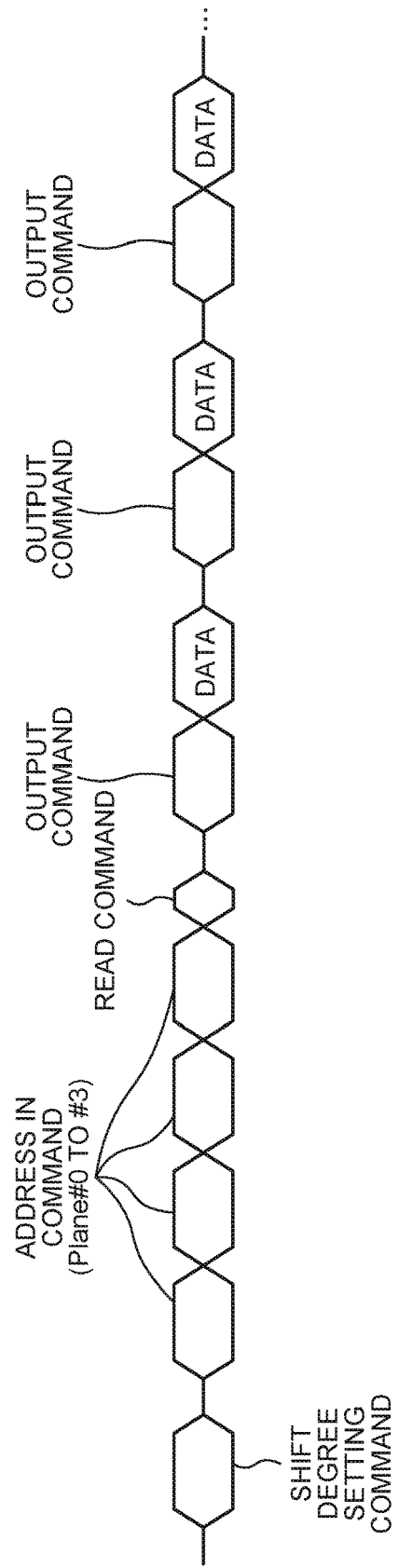
FIG. 13 is a diagram illustrating an example of a command sequence for multi-plane read.

The memory controller 2 can instruct a target memory chip 11 to execute multi-plane read. FIG. 13 is a diagram illustrating an example of a command sequence for multi-plane read. The NAND controller 23 executes I/O illustrated in FIG. 13 to/from the target memory chip 11 under the control of the processor. In the description of FIG. 13, the processor will be the actor of operation.

For execution of multi-plane read, the processor can first send a shift degree setting command to a target memory chip 11. The shift degree setting command is a command for making the memory chip 11 apply one or more shift degrees included in a shift pattern. Note that the use of the shift degree setting command is optional.

After sending the shift degree setting command, the processor serially sends an address-in command for each plane 122 to the target memory chip 11. Each address in command contains a physical address locating a page to be read. A physical address is information uniquely indicating a location in a storage area of the NAND memory 1 in a fixed manner. Any form of the physical address that at least indicates a memory cell uniquely in a fixed manner can be adopted. After sending all the addresses in command, the processor sends a read command to the target memory chip 11. In response to reception of the read command, the target memory chip 11 reads page data from the page indicated by a physical address specifying each plane 122 in to the associated page buffer 121. The processor detects completion of reading page data into all the page buffers 121 by monitoring RY/BY signals, for example. A RY/BY signal is a signal indicating a BY state during a period in which the target memory chip 11 is executing internal processing including access to the memory cell array 118, or indicating a RY state during a period in which the target memory chip 11 is not executing internal processing. After page data are stored in all the page buffers 121, the processor sends an output command to the target memory chip 11. The output command contains a physical address indicating a read start location of four page data read into the four page buffers 121, for example. In response to reception of the output command, the target memory chip 11 outputs data of a predetermined size or of a specified size from the location specified by the output command in one of the page buffers 121 to the memory controller 2. The predetermined size is equal to the size of a cluster, for example. The size of a cluster is larger than that of a sector. Alternatively, the memory controller 2 may specify the size of data to be read in the output command. In addition, the processor may control the size of data to be output by the target memory chip 11 by controlling the number of times an RE signal has been toggled. The processor can send an output command multiple times. The processor sends an output command by a unit of a cluster multiple times to make four page data to be output by a unit of a cluster, for example. According to multi-plane read, since read of page data from the memory cell array 118 into one page buffer 121 can be executed at the same time on multiple planes 122, the transfer rate of data from the NAND memory 1 to the memory controller 2 is improved as compared to a case where read is executed sequentially on the respective planes 122 in single plane read operation.

Note that part or the entire control on the command sequence may be executed by the NAND controller 23 without any involvement of the processor.

FIG. 14 is a table illustrating an example data structure of a retry read table 221 of the second embodiment. As illustrated, in the second embodiment, the retry read table 221 has a shift index recorded therein for each block group 124. In FIG. 14, a block group number is an identification number assigned to each block group 124. As an example, the processor executes a read process (including patrol read) by a unit of a block group 124. The processor executes the process of S303 by using multi-plane read. The processor also use a shift degree setting command in execution of the process of S303. To acquire a shift index, the processor searches the retry read table 221 using a block group number representing the block group 124 that is a target of the read process as a search key.

Alternatively, in the second embodiment, the processor may also execute the read process by a unit of a block. The processor acquires the block group number of the block group 124 to which the target block of the read process belongs, and searches the retry read table 221 using the acquired block group number as a search key.

In this manner, in the second embodiment, the processor manages the shift indices by a unit of multiple blocks to be controlled in parallel in one memory chip 11. As a result, the size of the retry read table 221 can further be reduced as compared to the case where the shift indices are managed by a unit of a block.

Third Embodiment

The processor may manage the shift indices by a unit of a logical block. A logical block is constituted by multiple blocks that can be accessed in parallel by the memory controller 2.

For example, according to the example of FIG. 1, eight memory chips 11 constituting the NAND memory 1 are connected to the memory controller 2 via four channels. Since the memory controller 2 can control the four channels independently of one another, the memory controller 2 can access up to four memory chips 11 at the same time. Four blocks that are different from one another in the channel required to be controlled for access can constitute one logical block.

As illustrated in the example of FIG. 12, in a case where each memory chip 11 includes four planes 122, a total of eight blocks that are different in either the channel required to be controlled for access or in the plane 122 to which for which the block belong can constitute one logical block.

One of the techniques of parallel operation is bank interleaving. Bank interleaving is a technique of shortening total processing time by issuing an access command to a bank by the memory controller 2 while one or more memory chips 11 belonging to another bank are accessing data. For example, in the memory system 100 illustrated in FIG. 1, one of two memory chips 11 connected to the same channel constitutes a bank #0 and the other constitutes a bank #1. A total of 16 blocks that are different in at least one of the channel required to be controlled for access, the bank to which the block belongs, and the plane 122 to which the block belongs can constitute one logical block.

FIG. 15 is a table illustrating an example data structure of the retry read table 221 of a third embodiment. As illustrated, in the third embodiment, the retry read table 221 has a shift index recorded therein for each logical block. In FIG. 15, a logical block number is an identification number assigned to each logical block. As an example, the processor executes a read process (including patrol read) by a unit of a logical block. To acquire a shift index, the processor searches the retry read table 221 using a logical block number representing the logical block that is a target of the read process as a search key.

In this manner, according to the third embodiment, the processor manages the shift indices by a unit of a logical block. As a result, the size of the retry read table 221 can further be reduced as compared to the case where the shift indices are managed by a unit of a block.

The manner in which a logical block is built can be designed in any manner. For example, one logical block is built up by multiple blocks including two blocks belonging to two memory chips, respectively, that are controlled in parallel.

Fourth Embodiment

The processor may convert various shift degrees acquired from the shift index table 222, and set the shift degrees obtained by the conversion in the memory chips 11.

Figures 16, 17:
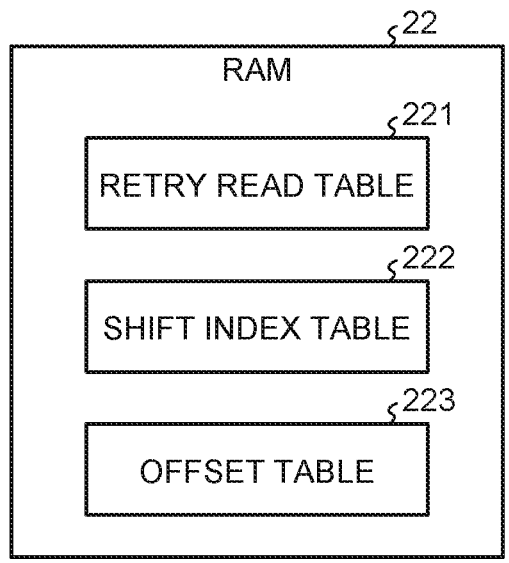
FIG. 16 is a diagram explaining various information of a fourth embodiment stored in a RAM.
FIG. 17 is a table illustrating an example data structure of an offset table.

FIG. 16 is a diagram explaining various information of a fourth embodiment for management of read voltages stored in the RAM 22. As illustrated, the RAM 22 stores therein the retry read table 221, the shift index table 222, and an offset table 223. Herein, as an example of the conversion, the processor adds offsets to the shift degrees acquired from the shift index table 222. The offset table 223 information is information in which the offsets are recorded in advance.

FIG. 17 is a table illustrating an example data structure of the offset table 223. According to the example of FIG. 17, the offset table 223 has an offset recorded therein for each word line. In FIG. 17, a word line number is an identification number for distinguishing each word line. Note that the word line number is an identification number unique to each word line and included in a certain range. For example, the word line numbers may be uniquely set in one block, and the same word line numbers may be used in multiple blocks.

A flash memory having a three-dimensional structure (BiCS: Bit Cost Scalable Flash Memory), for example, is known. The BiCS has the following configuration, for example. The BiCS includes multiple flat electrodes each functioning as a word line. The flat electrodes are stacked in the vertical direction with respect to the substrate. The BiCS includes a columnar electrode extending through multiple flat electrodes. At intersections of the columnar electrode and the flat electrodes, memory cells each including a charge trap layer in which charge is stored instead of the floating gate, and the like are formed. In the production process of the BiCS, a hole passing through multiple flat electrodes is formed for formation of the columnar electrode after the electrodes are staked on the substrate, for example. In a case where the BiCS is formed in this manner, it can be considered that the characteristics of the memory cells vary depending on the locations of the word lines in any block. In a case where the BiCS is applied as the memory cell array 118, the offsets for correcting the variation in the shift degrees depending on the word lines are recorded in advance in the offset table 223 as in the example of FIG. 17. Note that, in the example of FIG. 17, the word line numbers are used as location information indicating the locations of the word line. Information other than the word line numbers may be used as long as the information indicates the locations of the word lines. In a case where the BiCS is not used as the memory cell array 118, the offset table 223 may also be used.

Figure 18:
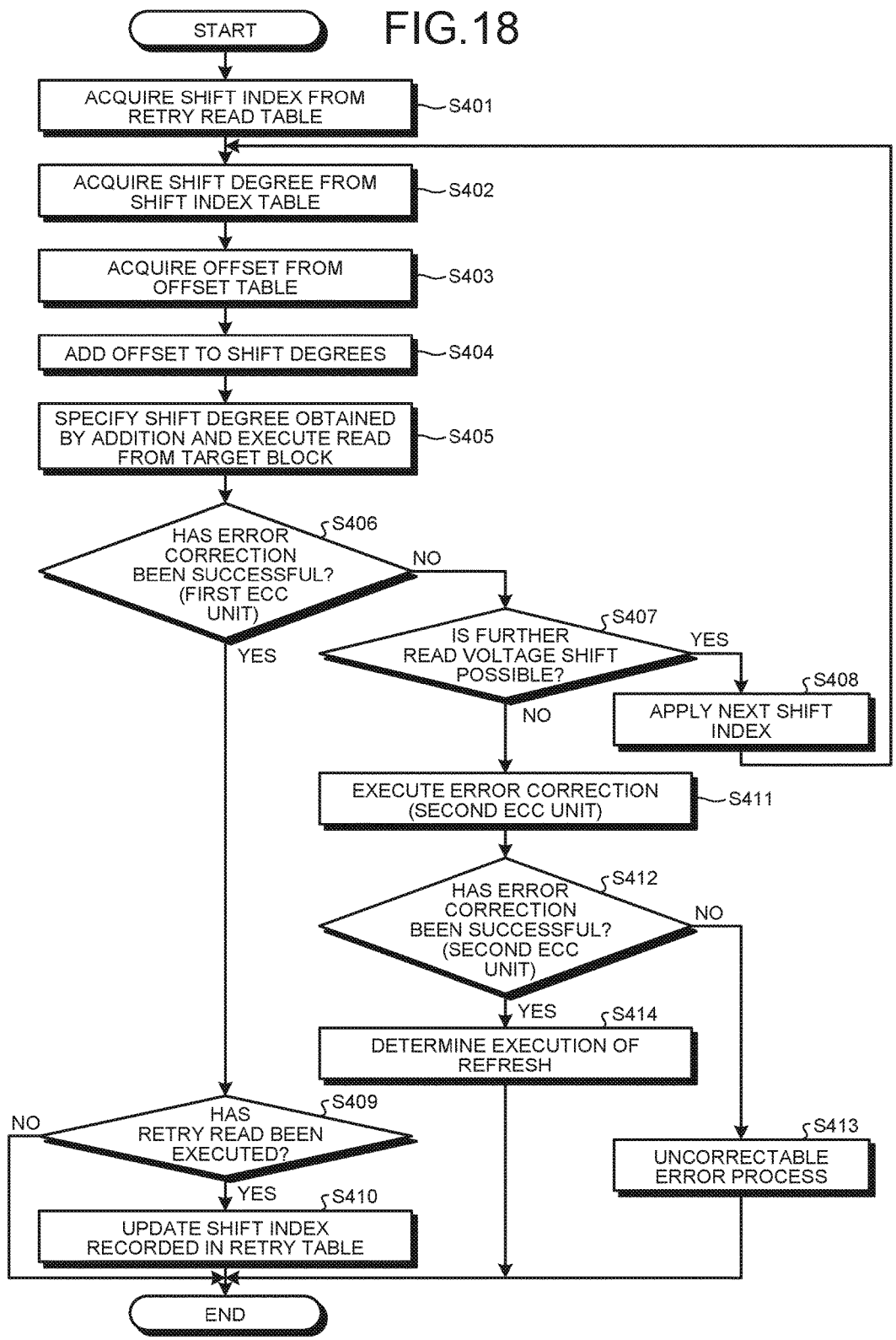
FIG. 18 is a flowchart explaining a read process of the fourth embodiment.

FIG. 18 is a flowchart explaining a read process of the fourth embodiment. First, the processor acquires a shift index associated with the target block by searching the retry read table 221 using the block number of the target block as a search key (S401). The processor acquires a shift pattern associated with the target block by searching the shift index table 222 using the acquired shift index as a search key (S402).

Subsequently, processor acquires an offset by searching the offset table 223 using the word line number indicating the word line in which data to be read is stored as a search key (S403). The processor adds the acquired offset to the shift degrees included in the acquired shift pattern (S404). The processor then specifies the shift degrees obtained by the addition and executes read from the target block (S405).

Subsequently, the processor executes the same processes as those in S304 to S312 in the processes of S406 to S414.

In the description above, it has been explained that the processor converts the shift degrees on the basis of the offset table 223. The manner in which the shift degrees are converted is not limited to that described above. For example, the processor may convert the shift degrees on the basis of a function defined in advance. Alternatively, the processor may convert the shift degrees in different manners for different read voltages.

As described above, according to the fourth embodiment, the processor converts the shift pattern acquired from the shift index table 222 and sets the read voltages VA to VC in the memory chips 11 on the basis of the shift pattern obtained by the conversion.

Fifth Embodiment

The processor may manage shift degrees by a unit of pages that share a word line. In a case where the 2-bit memory cell is adopted, for example, the processor manages the read voltage VB for reading a lower page and the read voltages VA and VC for reading an upper page by using different tables.

Figures 19, 20:
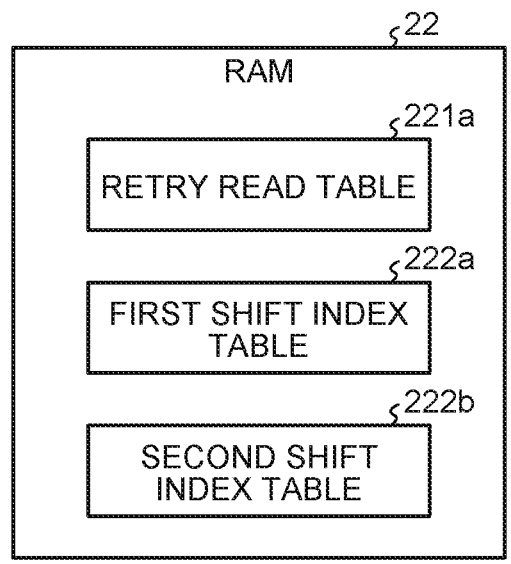
FIG. 19 is a diagram explaining various information of a fifth embodiment stored in a RAM.
FIG. 20 is a table illustrating an example data structure of a first shift index table.

FIG. 19 is a diagram explaining various information of a fifth embodiment for management of the read voltages stored in the RAM 22. As illustrated, the RAM 22 stores therein a retry read table 221a, a first shift index table 222a, and a second shift index table 222b.

FIG. 20 is a table illustrating an example data structure of the first shift index table 222a. As illustrated, the first shift index table 222a has recorded therein a shift degree B for each shift pattern. A first shift index is assigned to each shift degree B recorded in the first shift index table 222a.

FIG. 21 is a table illustrating an example data structure of the second shift index table 222b. As illustrated, the second shift index table 222b has recorded therein a pair of a shift degree A and a shift degree C. for each shift pattern. A second shift index is assigned to each pair recorded in the second shift index table 222b.

FIG. 22 is a table illustrating an example data structure of the retry read table 221a. As illustrated, the retry read table 221a has recorded therein the first shift index and the second shift index for each block.

The processor determines which of the first shift index and the second shift index to acquire from the retry read table 221a depending on whether data to be read is stored in the lower page or in the upper page.

In the description above, cases in which a 2-bit memory cell is adopted have been described. The above description can also be applied to a case where a 3-bit or larger bit memory cell is adopted. According to the 3-bit memory cell, for example, three pages including an upper page, a middle page, and a lower page are formed in one word line. In this case, the processor includes different index tables 222 for the upper page, the middle page, and the lower page.

In this manner, the processor may manage the shift degrees by a unit of pages that share a word line.

Sixth Embodiment

Figure 23:
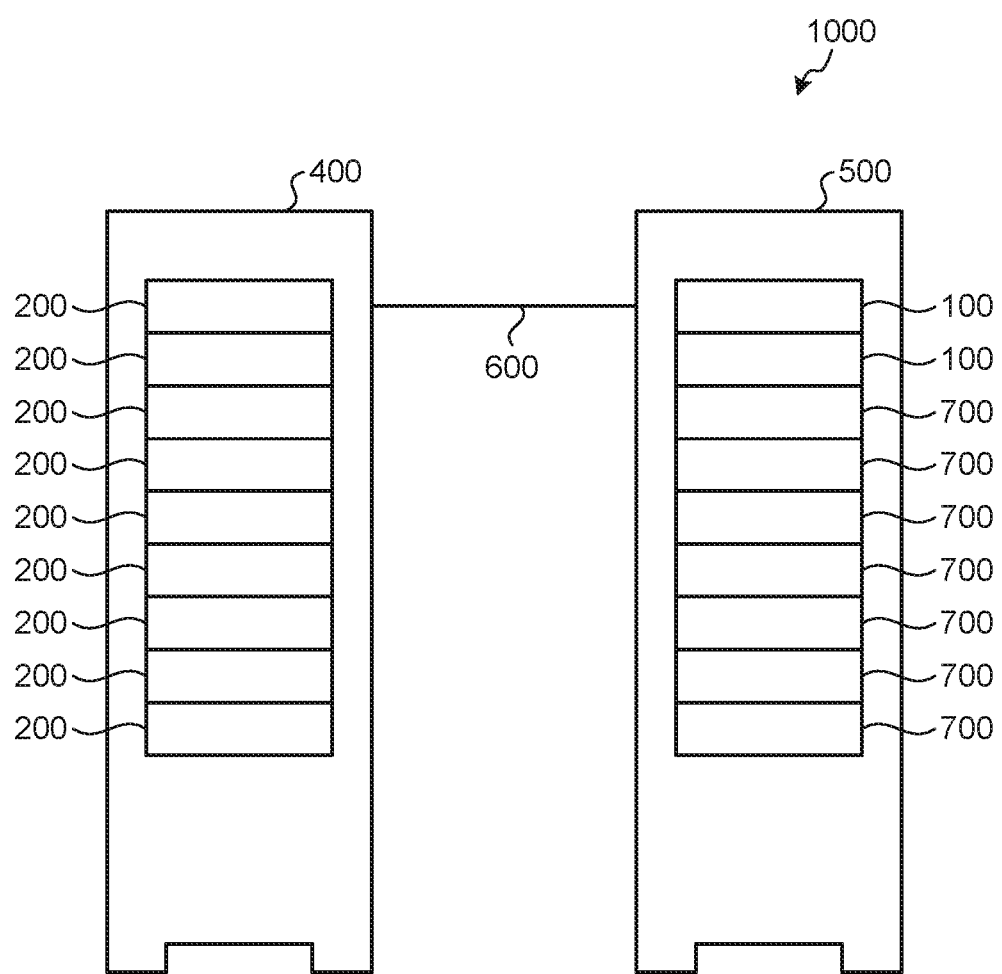
FIG. 23 is a diagram illustrating an example mounting of a memory system.

FIG. 23 is a diagram illustrating an example mounting of the memory system 100. The memory system 100 is mounted on a server system 1000, for example. The server system 1000 includes a rack mount server 400 and a disk array 500 that are connected by a communication interface 600. Any standard may be adopted for the standard of the communication interface 600. The rack mount server 400 includes one or more host devices 200 mounted on a server rack. The host devices 200 can access the disk array 500 via the communication interface 600.

The disk array 500 includes one or more memory systems 100 and one or more hard disk units 700 mounted on a server rack. Each memory system 100 can respond to a read request from each host device 200. Furthermore, each memory system 100 has a configuration adopting any of the first to fifth embodiments.

In the disk array 500, each memory system 100 may be used as a cache for one or more hard disk units 700, for example. The disk array 500 may be provided with a storage controller unit mounted thereon and configured to build RAIDs in one or more hard disk units 700.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory configured to be written data therein, the memory being capable of changing a potential used for determination of the data in reading of the data;
a controller configured to read first data from the memory by making the memory use a first potential, execute error detection and correction of the first data read from the memory by using the first potential, read the first data from the memory by making the memory use a second potential, execute error detection and correction of the second data read from the memory by using the second potential differing from the first potential, and make the memory use a third potential in reading second data from the memory in a case where the error detection and correction of the first data read by using the third potential is successful, the third potential being the first potential or the second potential, wherein the memory includes multiple block groups,
each of the multiple block groups includes one or more blocks,
each of the one or more blocks is a unit of erase, and
the controller stores information relating to the third potential for each of the multiple block groups.

2. The memory system according to claim 1, wherein, after error detection and correction of the first data read by using the first potential is failed, the controller read the first data from the memory by making the memory use the second potential.

3. The memory system according to claim 2, wherein the controller executes refresh of the first data at least on the basis of whether or not error detection and correction of the first data read by using the second potential is failed.

4. The memory system according to claim 3, wherein the controller read the first data from the memory by making the memory use the first potential periodically.

5. The memory system according to claim 1, wherein
each of the multiple block groups includes two or more blocks, and
the controller accesses the two or more blocks included in a same block group among the multiple block groups in parallel.

6. The memory system according to claim 5, wherein
the memory includes first and second chips,
the two or more blocks included in the same block group includes a first block and a second block,
the first chip includes the first block, and
the second chip includes the second block.

7. A method for reading data from a memory by making the memory use a potential, the memory including multiple block groups, each of the multiple block groups including one or more blocks, each of the one or more blocks being a unit of erase, the method comprising:
reading first data from the memory by making the memory use a first potential;
executing error detection and correction of the first data read from the memory by using the first potential;
reading the first data from the memory by making the memory use a second potential differing from the first potential;
executing error detection and correction of the second data read from the memory by using the second potential; and
making the memory use a third potential in reading second data from the memory in a case where the error detection and correction of the first data read by using the third potential is successful, the third potential being the first potential or the second potential, wherein the method further comprising storing information relating to the third potential for each of the multiple block groups.

8. The method according to claim 7, wherein the reading the first data from the memory by making the memory use the second potential is reading the first data from the memory by making the memory use the second potential after the error detection and correction of the first data read by using the first potential is failed.

9. The method according to claim 8 further comprising executing refresh of the first data at least on the basis of whether or not the error detection and correction of the first data read by using the second potential is failed.

10. The method according to claim 9, wherein the reading the first data from the memory by making the memory use the first potential is reading the first data from the memory by making the memory use the first potential periodically.

11. The method according to claim 7, wherein
each of the multiple block groups includes two or more blocks, and the method comprising accessing the two or more blocks included in a same block group among the multiple block groups in parallel.

12. The method according to claim 11, wherein
the memory includes first and second chips,
the two or more blocks included in the same block group includes a first block and a second block,
the first chip includes the first block, and
the second chip includes the second block.

* * * * *